(12) United States Patent
Kim et al.

(10) Patent No.: US 12,471,222 B2
(45) Date of Patent: Nov. 11, 2025

(54) CIRCUIT BOARD FOR ANTENNA, ANTENNA PACKAGE INCLUDING THE SAME AND IMAGE DISPLAY DEVICE INCLUDING THE SAME

(71) Applicant: DONGWOO FINE-CHEM CO., LTD., Jeollabuk-do (KR)

(72) Inventors: Dae Kyu Kim, Gyeonggi-do (KR); Byung Soo Bang, Gyeonggi-do (KR); Gi Taek Oh, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 265 days.

(21) Appl. No.: 18/209,551

(22) Filed: Jun. 14, 2023

(65) Prior Publication Data

US 2023/0422409 A1   Dec. 28, 2023

(30) Foreign Application Priority Data

Jun. 22, 2022   (KR) .......................... 10-2022-0076118

(51) Int. Cl.
| | |
|---|---|
| *H01Q 1/22* | (2006.01) |
| *H01Q 21/08* | (2006.01) |
| *H05K 1/02* | (2006.01) |
| *H05K 3/46* | (2006.01) |

(52) U.S. Cl.
CPC .......... *H05K 3/4605* (2013.01); *H01Q 1/2291* (2013.01); *H05K 1/0242* (2013.01); *H05K 2201/093* (2013.01); *H05K 2201/10098* (2013.01); *H05K 2201/10128* (2013.01)

(58) Field of Classification Search
CPC .... H01Q 1/2283; H01Q 1/2291; H01Q 1/243; H01Q 1/46; H01Q 21/08
See application file for complete search history.

(56) References Cited

U.S. PATENT DOCUMENTS

| | | | |
|---|---|---|---|
| 2007/0229366 A1* | 10/2007 | Kim ......................... | H01Q 9/42 343/846 |
| 2022/0190467 A1* | 6/2022 | Kim ....................... | H01Q 21/08 |
| 2022/0190469 A1* | 6/2022 | Kim ......................... | H01Q 1/38 |

FOREIGN PATENT DOCUMENTS

| | | |
|---|---|---|
| KR | 10-2020-0005950 A | 1/2020 |
| WO | WO 2011/100492 A1 | 8/2011 |

* cited by examiner

*Primary Examiner* — Hoang V Nguyen
(74) *Attorney, Agent, or Firm* — The PL Law Group, PLLC

(57) ABSTRACT

A circuit board for an antenna may include a core layer, a signal wiring disposed on a surface of the core layer, and a co-planar ground disposed around the signal wiring on the surface of the core layer. The co-planar ground may include line patterns adjacent to a front end portion of the signal wiring.

17 Claims, 7 Drawing Sheets

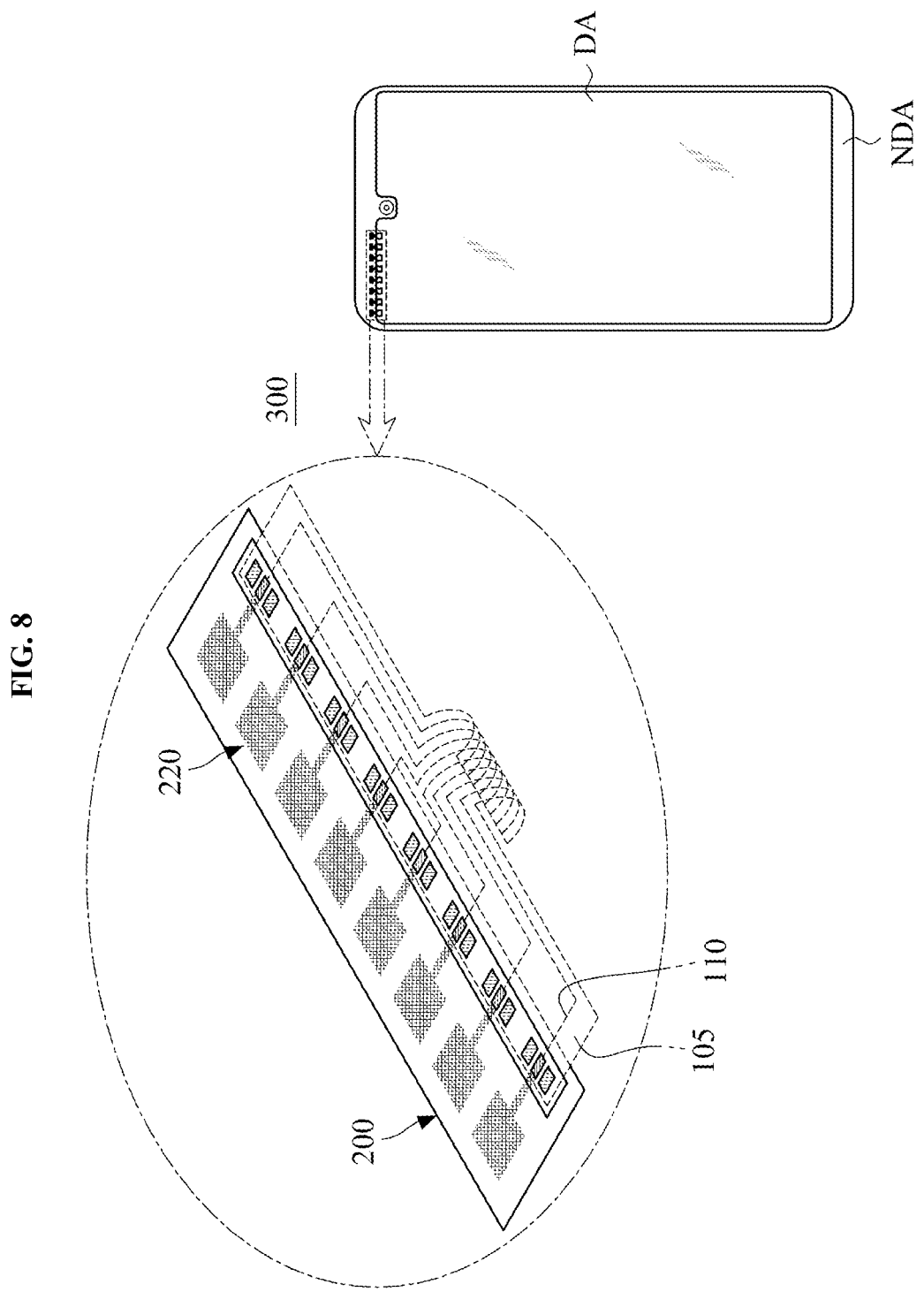

CIRCUIT BOARD FOR ANTENNA, ANTENNA PACKAGE INCLUDING THE SAME AND IMAGE DISPLAY DEVICE INCLUDING THE SAME

CROSS-REFERENCE TO RELATED APPLICATION AND CLAIM OF PRIORITY

This application claims the benefit under 35 USC § 119 of Korean Patent Application No. 10-2022-0076118 filed on Jun. 22, 2022 in the Korean Intellectual Property Office (KIPO), the entire disclosures of which is incorporated herein by reference for all purposes.

BACKGROUND

1. Field

The present invention relates to a circuit board for an antenna, an antenna package including the same and an image display device including the same. More particularly, the present invention relates to a circuit board for an antenna including a feeding circuit wiring, an antenna package including the same and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

Recently, as mobile communication technologies have been developed, an antenna for a communication in a high frequency or an ultra-high frequency band is needed in the image display device.

For example, an antenna may be coupled with a circuit board, and the circuit board may be connected to an integrated circuit for driving the antenna. Feeding may be performed to the antenna through the circuit board and a signal for driving control may be transmitted.

A bonding intermediate film such as an anisotropic conductive film may be used to couple the antenna and the circuit board. The bonding intermediate film may include an adhesive resin material and conductive particles to provide adhesive strength and conductivity.

For example, non-uniform distribution of the resin material and the conductive particles, and deviation of a conductive activation may occur in a bonding process including heat-pressing process. Accordingly, both adhesive strength and conductivity of the bonding structure through the bonding intermediate film may be degraded.

SUMMARY

According to an aspect of the present invention, there is provided a circuit board for an antenna providing improved physical and electrical reliability.

According to an aspect of the present invention, there is provided an antenna package including a circuit board for an antenna that provides improved physical and electrical reliability.

According to an aspect of the present invention, there is provided an image display device including the antenna package.

(1) A circuit board for an antenna, including: a core layer; a signal wiring disposed on a surface of the core layer; and a co-planar ground disposed around the signal wiring on the surface of the core layer, the co-planar ground including line patterns adjacent to a front end portion of the signal wiring.

(2) The circuit board for an antenna according to the above (1), wherein a plurality of the line patterns are arranged at each of both lateral sides of the front end portion of the signal wiring.

(3) The circuit board for an antenna according to the above (1), wherein a plurality of the signal wirings are arranged in a width direction of the core layer, and a plurality of the line patterns are arranged between neighboring signal wirings of the plurality of the signal wirings.

(4) The circuit board for an antenna according to the above (1), wherein the core layer has a first region in which the front end portion of the signal wiring is disposed and a second region adjacent to the first region, and the co-planar ground has a solid conductive layer structure in the second region.

(5) The circuit board for an antenna according to the above (4), wherein a pair of the co-planar grounds are disposed with the signal wiring interposed therebetween in the second region.

(6) The circuit board for an antenna according to the above (1), wherein the signal wiring has a branched structure including a plurality of feeding portions, and the line patterns are arranged around the feeding portions.

(7) The circuit board for an antenna according to the above (6), wherein bonding units are defined by one feeding portion of the feeding portions, and the line patterns arranged at both lateral sides of the one feeding portion, and the line patterns in each of the bonding units are spaced apart by a first slit, and the bonding units neighboring each other are spaced apart by a second slit.

(8) The circuit board for an antenna according to the above (7), wherein a width of the second slit is greater than a width of the first slit.

(9) An antenna package, including: an antenna device; and a circuit board bonded with the antenna device, the circuit board including: a core layer; a signal wiring disposed on a surface of the core layer; and a co-planar ground disposed around the signal wiring on the surface of the core layer, the co-planar ground including line patterns adjacent to a front end portion of the signal wiring.

(10) The antenna package according to the above (9), further including a bonding intermediate film coupling the antenna device and the circuit board.

(11) The antenna package according to the above (10), wherein the line patterns are spaced apart with slits interposed therebetween, and the bonding intermediate film is attached on the line patterns to fill the slits.

(12) The antenna package according to the above (11), wherein the bonding intermediate film has convex portions on the line patterns.

(13) The antenna package according to the above (9), wherein the antenna device includes: a dielectric layer; and an antenna unit disposed on the dielectric layer, the antenna unit including a radiator, a transmission line extending from the radiator, a signal pad formed at an end portion of the transmission line and a ground pad disposed around the signal pad.

(14) The antenna package according to the above (13), wherein the line patterns include first line patterns arranged on the ground pad and second line patterns not overlapping the ground pad.

(15) The antenna package according to the above (14), wherein the number of the second line patterns is greater than the number of the first line patterns.

(16) An image display device, including: a display panel; an antenna unit disposed on the display panel; and the circuit board for an antenna according to the above-described embodiments electrically connected to the antenna unit.

(17) The image display device according to the above (16), further including an antenna driving integrated circuit chip disposed under the display panel.

(18) The image display device according to the above (17), wherein the circuit board for the antenna is bent under the display panel to be electrically connected to the antenna driving integrated circuit chip.

A circuit board for an antenna according to embodiments of the present invention may include a signal wiring and a co-planar ground formed on a surface of a core layer. The co-planar ground may be arranged around the signal wiring to promote noise absorption/removal and improvement of feeding efficiency.

In example embodiments, a bonding portion of the co-planar ground may include a plurality of line patterns spaced apart from each other. The line patterns may serve as buffer patterns for evenly distributing heat and pressure during a bonding process using a bonding intermediate film such as an anisotropic conductive film. Thus, a uniform adhesive strength may be provided throughout the bonding intermediate film, and adhesion reliability of an antenna device and the circuit board for an antenna may be improved.

In some embodiments, a portion of the bonding intermediate film overlapping the line patterns may include protrusions. An adhesive area between the antenna device and the bonding intermediate film may be increased by the protrusions, so that mechanical reliability of an antenna package may be further improved.

BRIEF DESCRIPTION OF THE DRAWINGS

FIGS. 7 and 8 are a schematic cross-sectional view and a schematic plan view, respectively, illustrating an image display device including an antenna package in accordance with exemplary embodiments.

DETAILED DESCRIPTION OF THE EMBODIMENTS

According to embodiments of the present invention, a circuit board for an antenna including a ground and a signal wiring is provided. Additionally, an antenna package and an image display device including the antenna circuit board are provided.

An application of the circuit board for an antenna or the antenna package is not limited to a display device, and may be applied to various objects or structures such as vehicles, home appliances and buildings.

In exemplary embodiments, a radiator of the antenna package may be disposed in a display area of the image display device. Accordingly, the antenna package may be provided as an antenna package for an AOD (Antenna-On Display).

In some embodiments, the antenna package may be manufactured in the form of a microstrip patch combined with an antenna device. The antenna device or the antenna package may be applied to a communication device for, e.g., 3G, 4G, 5G or higher high-frequency or ultra-high frequency mobile communication.

For example, the antenna device may be driven in a high frequency or ultra-high frequency band of about 1 GHz or more, in one embodiment, from about 20 to 70 GHz. The antenna device may also be driven in a frequency band of, e.g., 1 GHz or less. Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", etc., used herein do not designate an absolute position, but are relatively used to distinguish different elements or different positions.

Figure 1:
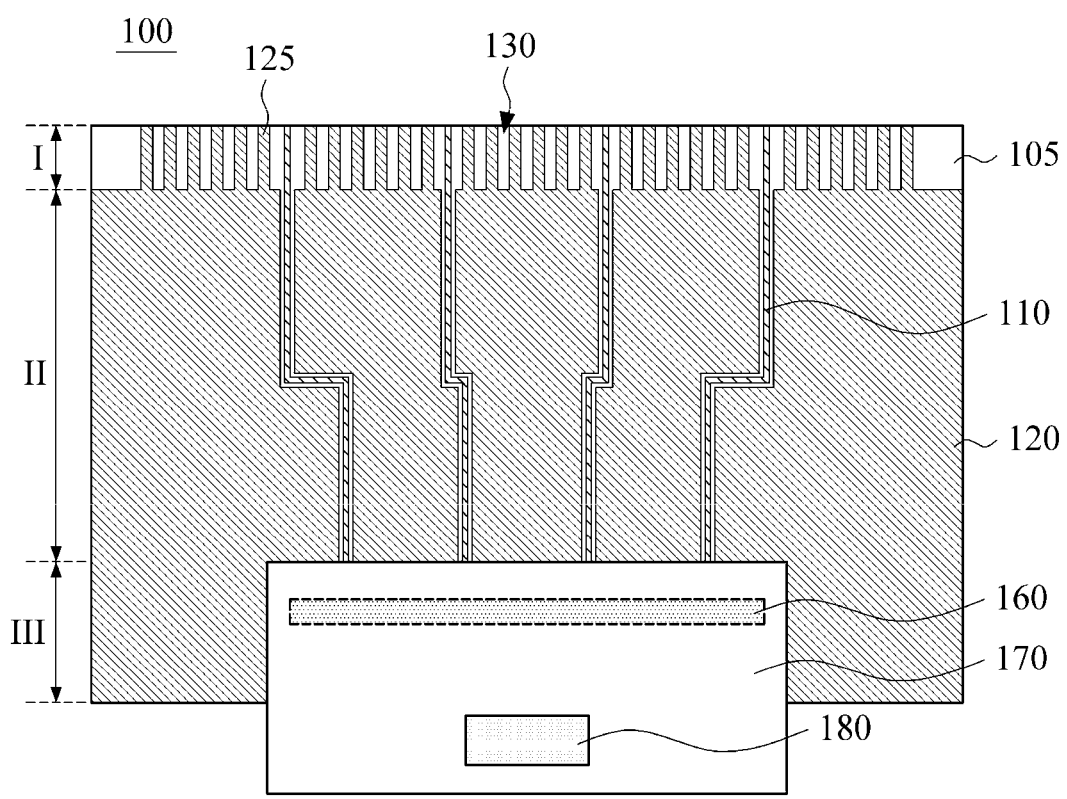
FIG. 1 is a schematic plan view illustrating a circuit board for an antenna in accordance with exemplary embodiments.

FIG. 1 is a schematic plan view illustrating a circuit board for an antenna in accordance with exemplary embodiments.

Referring to FIG. 1, a circuit board for an antenna 100 (hereinafter, that may be abbreviated as a circuit board) may include a core layer 105, and a signal wiring 110 and a co-planar ground 120 formed on a surface of the core layer 105.

The core layer 105 may serve as an insulating substrate of the circuit board 100. For example, the core layer 105 may include a flexible resin such as a polyimide resin, modified polyimide (MPI), an epoxy resin, polyester, a cyclo-olefin polymer (COP), a liquid crystal polymer (LCP), etc. The core layer 105 may include an internal insulating layer included in the circuit board 100.

The signal wiring 110 and the co-planar ground 120 may include a metal such as silver (Ag), gold (Au), copper (Cu), aluminum (Al), platinum (Pt), palladium (Pd), chrome (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca), etc., or an alloy containing at least one of these metals. These may be used alone or in a combination of two or more therefrom.

For example, the signal wiring 110 and the co-planar ground 120 may each include copper or a copper alloy. In one embodiment, the circuit board 100 may be a flexible printed circuit board (FPCB) prepared from a copper clad laminate. For example, the signal wiring 110 and the co-planar ground 120 may be formed by patterning a copper foil layer included in the copper clad laminate.

The circuit board 100 or the core layer 105 may include a first region I, a second region II and a third region III.

In example embodiments, the first region I may be provided as a bonding region where the circuit board 100 is coupled or adhered to an antenna device. The third region III may be an external connection region or a connector region where the circuit board 100 is coupled to an external circuit.

The second region II may be provided as an extension region or a middle region of the signal wiring 110.

The signal wiring 110 may continuously extend over the first region I, the second region II and the third region III of the core layer 105. In some embodiments, as illustrated in FIG. 1, a plurality of the signal wirings 110 may be arranged along a width direction of the circuit board 100.

In one embodiment, the plurality of the signal wirings 110 may be independently separated from each other and physically spaced apart along the width direction.

A front end portion of the signal wiring 110 may be disposed in the first region I and may serve as a feeding portion to the antenna device. A rear end portion of the signal wiring 110 may be disposed in the third region III and electrically connected to the external circuit structure.

In some embodiments, the rear end portion of the signal wiring 110 may be coupled to a connector 160. The circuit board 100 and a chip mounting board 170 may be coupled to each other through the connector 160.

An antenna driving integrated circuit (IC) chip 180 may be mounted on the chip mounting board 170. An antenna feeding path to the antenna driving integrated circuit (IC) chip 180—the signal wiring 110—the antenna device may be implemented through an internal circuit included in the chip mounting board 170. For example, the chip mounting board 170 may be a rigid printed circuit board (Rigid-PCB).

The co-planar ground 120 may be disposed on the surface of the core layer 105 together with the signal wiring 110. The co-planar ground 120 may be disposed at the same layer or the same level as that of the signal wiring 110.

As illustrated in FIG. 1, the co-planar ground 120 may be physically separated from the signal wiring 110 with a predetermined distance therebetween. In some embodiments, a pair of the co-planar grounds 120 may extend together with the signal wiring 110 interposed therebetween.

In some embodiments, the co-planar ground 120 and the signal wiring 110 may extend together across the first region I, the second region II and the third region III.

In example embodiments, the co-planar ground 120 may include line patterns 125 in the first region I. The line patterns 125 may protrude from a front end portion of the co-planar ground 120 in the second region II to the first region I.

The line patterns 125 may be spaced apart from each other in the first region I and repeatedly arranged along the width direction of the circuit board 100. For example, a slit 130 may be formed between the line patterns 125.

A plurality of the line patterns 125 may be arranged around the front end portion of the signal wiring 110. In some embodiments, a plurality of the line patterns 125 may be arranged on each of both lateral sides of the front end portion of the signal wiring 110.

As described above, a plurality of the signal wirings 110 may be arranged along the width direction. In this case, a plurality of the line patterns 125 may be arranged between the front end portions of the signal wirings 110 neighboring in the width direction.

The line patterns 125 may be spaced apart from each other and arranged around the signal wiring 110, so that a heat applied in a heat-pressing process performed in the bonding region (e.g., the first region I) with the antenna device may be uniformly distributed throughout the bonding region. Additionally, an adhesive material may be filled through the slit 130 between the line patterns 125 so that bonding stability between the antenna device and the circuit board 100 may be improved.

For example, a width of each of the line patterns 125 may be in a range from 0.05 mm to 0.2 mm, and an interval between the line patterns 125 may be in a range from 0.05 mm to 0.2 mm. In one embodiment, the width of each of the line patterns 125 and the interval between the line patterns 125 may be substantially the same.

In some embodiments, a length of each of the line patterns 125 may be in a range from 0.2 mm to 0.7 mm or from 0.3 to 0.6 mm. In one embodiment, a ratio of the length to the width of the line pattern 125 may be in a range from 2 to 10, preferably from 3 to 6.

The co-planar ground 120 may have a solid plate or solid film shape in the second region II. For example, the co-planar ground 120 may not include a vacancy such as a slit, an opening or a hole therein in the second region II.

In some embodiments, the co-planar ground 120 may also extend to the third region III in the solid structure.

The co-planar ground 120, which is a solid conductive layer, may be disposed around the signal wiring 110 in the second region II, so that noises may be blocked and an electric field may be concentrated around the signal wiring 110. Thus, an impedance from the antenna driving IC chip 180 to the antenna device may be reduced and feeding efficiency may be increased. Further, signal loss occurring in the antenna device may be suppressed.

Figure 2:
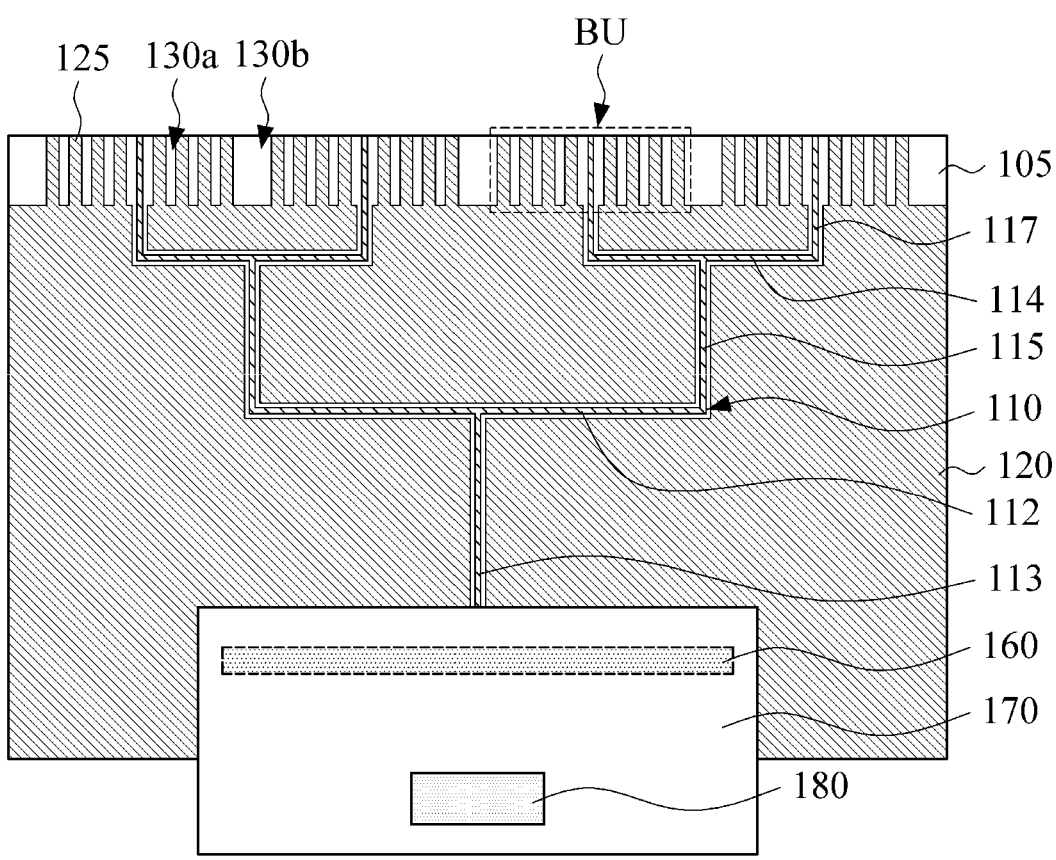
FIG. 2 is a schematic plan view illustrating a circuit board for an antenna in accordance with exemplary embodiments.

FIG. 2 is a schematic plan view illustrating a circuit board for an antenna in accordance with exemplary embodiments.

Referring to FIG. 2, the signal wiring 110 may have a branched structure. Accordingly, a plurality of antenna units may be connected through one signal wiring 110 to form a radiation group by the signal wiring 110 of the circuit board 100.

For example, the signal wiring 110 may sequentially include an external circuit connecting portion 113, a first merging portion 112, a branch portion 115, a second merging portion 114 and a feeding portion 117 from a rear end to a front end thereof.

One end portion of the external circuit connecting portion 113 may be a portion that is adjacent and electrically connected to the antenna driving IC chip 180 or the connector 160. The first merging portion 112 may horizontally extend and may be connected to the other end portion of the external circuit connecting portion 113, and the branch portion 115 (e.g., a pair of the branch portion 115) may extend from the first merging portion 112.

The second merging portion 114 may extend horizontally and may be connected to each end portion of the branch portions 125, and the feeding portions 117 (e.g., a pair of the feeding portions) may extend from each of the second merging portion 114. Each of the feeding portions 117 may be bonded to one antenna unit.

According to the embodiment illustrated in FIG. 2, four antenna units may be coupled through one signal wiring 110 to form one radiation group. Accordingly, a passive-type antenna package in which a plurality of antenna units are powered/driven together through one signal wiring 110 may be provided.

The line patterns 125 protruding from the co-planar ground 120 may be arranged around each feeding portion 117. The line patterns 125 may be spaced apart with slits 130a and 130b interposed therebetween, and may be repeatedly arranged along the width direction. The slits may include a first slit 130a and a second slit 130b.

As indicated in FIG. 2, a bonding unit BU may be defined by the feeding portion 117 of one signal wiring 110 and the line patterns 125 disposed at both lateral sides of the feeding portion 117. Within the bonding unit BU, the line patterns 125 may be spaced apart from each other by the first slit 130a.

The neighboring bonding units BU may be spaced apart from each other by the second slit 130b. In example embodiments, a width of the second slit 130b may be greater than a width of the first slit 130a. Accordingly, an electric field interference between the neighboring bonding units BU may be suppressed to improve radiation reliability through each antenna unit.

Figure 3:
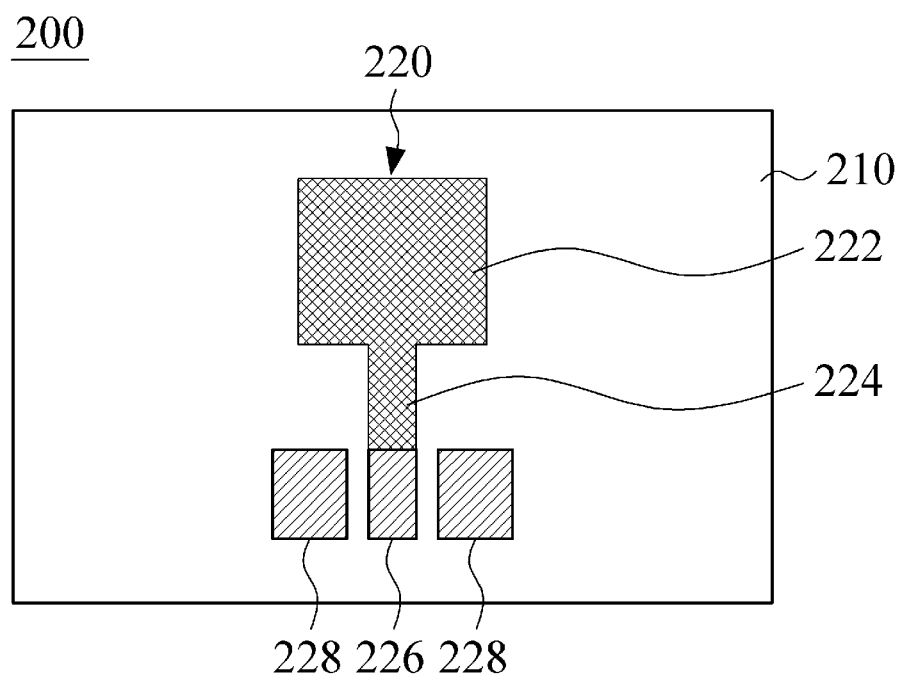
FIG. 3 is a schematic plan view illustrating an antenna device in accordance with exemplary embodiments.

FIG. 3 is a schematic plan view illustrating an antenna device in accordance with exemplary embodiments.

Referring to FIG. 3, the antenna unit 220 may include a radiator 222 and a transmission line 224. In some embodiments, the radiator 222 may have a polygonal plate shape and may have a mesh structure. Accordingly, the radiator 222 may have improved transmittance and may be disposed within a display area of an image display device.

The transmission line 224 may be integrally connected to the radiator 222 and may be electrically connected to the feeding portion (or the front end portion) of the signal wiring 110 of the circuit board 100. As will be described later, a terminal end portion of the transmission line 224 and the feeding portion of the signal wiring 110 may be bonded to each other using a bonding intermediate film such as an anisotropic conductive film (ACF) and using the first region I of the circuit board 100.

The transmission line 224 may have a mesh structure substantially the same as or similar to that of the radiator 222. In some embodiments, the transmission line 224 may be disposed at least partially within a bezel area or a non-display area of an image display device. In this case, the transmission line 224 may be formed as a solid line to provide reduced resistance and increased signal speed.

The transmission line 224 may be formed as a single member substantially integral with the radiator 222 and may have a smaller width than that of the radiator 222.

The antenna unit 220 may further include a signal pad 226. The signal pad 226 may be connected to a terminal end portion of the transmission line 224. In one embodiment, the signal pad 226 may be formed as a substantially integral member with the transmission line 224, and the terminal end portion of the transmission line 224 may serve as the signal pad 226.

In some embodiments, a ground pad 228 may be disposed around the signal pad 226. For example, a pair of the ground pads 228 may be disposed to face each other with the signal pad 226 interposed therebetween.

For example, the ground pad 228 may be electrically and physically separated from the transmission line 224 around the signal pad 226. The ground pad 228 may serve as a bonding pad to improve bonding stability with the bonding intermediate film.

The signal pad 226 and the ground pad 228 may be solid patterns formed of the above-described metal or alloy in consideration of reduction of the feeding resistance and efficiency of noise absorption.

In example embodiments, one radiator 222 may correspond to one transmission line 224 or one signal pad 226 to be connected thereto.

In example embodiments, the antenna unit 220 or the radiator 222 may be designed to transmit and receive signals in a high frequency or ultra-high frequency (e.g., 3G, 4G, 5G or higher) band. For example, a resonance frequency of the antenna unit 220 or the radiator 222 may be 10 GHz or more, from 10 GHz to 70 GHz, preferably from 20 GHz to 70 GHz. In one embodiment, the resonance frequency of the antenna unit 120 may be about 28 GHz or more, about 35 GHz or more, or from 36 GHz to 40 GHz. In one embodiment, the resonance frequency of the antenna unit 220 may be about 50 GHz or more, e.g., from about 50 GHz to 70 GHz.

The antenna unit 220 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in a combination of two or more therefrom.

In one embodiment, the antenna unit 220 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit 220 or the radiator 222 may include a transparent conductive oxide such as indium tin oxide (ITO), indium zinc oxide (IZO), zinc oxide (ZnOx), indium zinc tin oxide (IZTO), etc.

In some embodiments, the antenna unit 220 or the radiator 222 may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The radiator 222 may include a blackened portion, so that a reflectance at a surface of the antenna unit 222 may be decreased to suppress a visual recognition of the antenna unit due to a light reflectance.

In one embodiment, a surface of the metal layer included in the antenna unit 220 may be converted into a metal oxide or a metal sulfide to form a blackened layer. In an embodiment, a blackened layer such as a black material coating layer or a plating layer may be formed on the antenna unit 220 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, a dummy mesh electrode (not illustrated) may be formed around the radiator 222.

Figure 4:
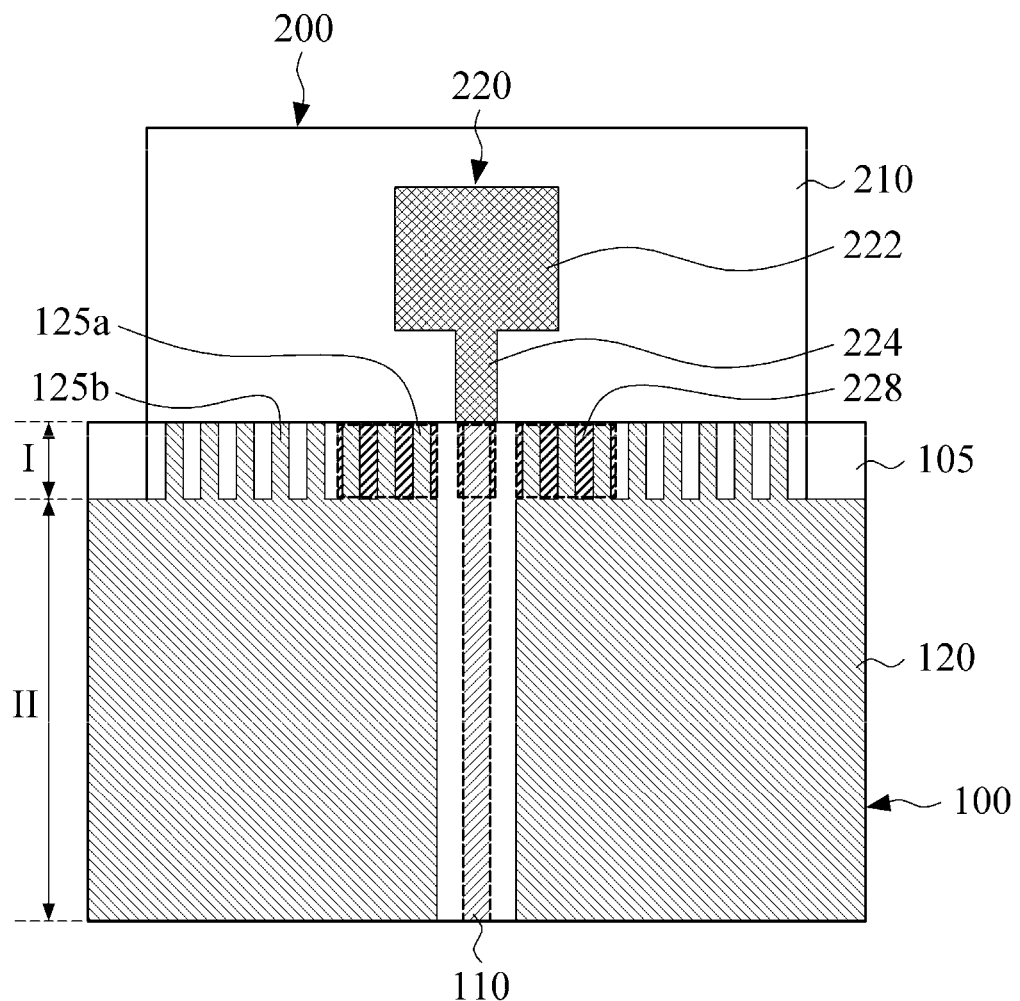
FIG. 4 is a schematic plan view illustrating an antenna package in accordance with exemplary embodiments.

FIG. 4 is a schematic plan view illustrating an antenna package in accordance with exemplary embodiments. For convenience of descriptions, illustration of the bonding intermediate film is omitted in FIG. 4.

Referring to FIG. 4, the above-described circuit board 100 and the antenna device 200 may be combined to obtain an antenna package.

In example embodiments, the bonding intermediate film may be attached to a bonding region including the signal pad 126 and the ground pad 128 of the antenna device 200. Thereafter, the first region I of the circuit board 100 including the line patterns 125 may be aligned on the bonding intermediate film, and a heat-compression process may be performed.

The front end portion (or the feeding portion) of the signal wiring 110 may be bonded to the signal pad 126 and electrically connected to the signal pad 126.

In some embodiments, the line patterns 125 may include first line patterns 125a bonded on the ground pad 228 of the antenna device 100, and second line patterns 125b that may be bonded on the dielectric layer 210 of the antenna device 100 and may not overlap the ground pad 228.

In some embodiments, a plurality of the first line patterns 125a (e.g., two or more, or three or more) may be superimposed on or bonded to one ground pad 228 in a plan view. Accordingly, adhesion between the ground pad 228 and the first line patterns 125a may be improved, and bending stability of the circuit board 100 may be further improved.

For example, the number of the second line patterns 125b may be greater than the number of first line patterns 125a. Accordingly, sufficient bonding stability may be provided on the dielectric layer 210. Additionally, the ground pad 228 and the first line patterns 125a may be connected to each other to further improve the noise shielding efficiency of the antenna device 200.

FIG. 4 shows one antenna unit 220 and one signal wire 110, but the antenna device 100 may include a plurality of the antenna units 220.

In one embodiment, a plurality of the antenna units 220 may be connected to the circuit board 100 as described with reference to FIG. 1. In this case, each of the antenna units 220 may be independently connected to the signal wiring 110. Accordingly, an active-type antenna package in which an individual and independent feeding/control of each radiator 222 is performed may be implemented.

In one embodiment, a plurality of the antenna units 220 may be connected to the circuit board 100 as described with reference to FIG. 2. In this case, a passive-type antenna package in which a plurality of the antenna units 220 are fed/controlled as a radiation group through one signal wiring 110 including a plurality of feeding portions may be implemented.

As described above, the co-planar ground 120 may be physically separated from the signal wiring 110, and may not be electrically connected to the signal wiring 110. Accordingly, the line patterns 125a and 125b included in the co-planar ground 120 are separated from the signal wiring 110 and may not be connected to the signal pad 126 of the antenna unit 220.

Accordingly, the line patterns 125a and 125b may improve bonding stability with the antenna device 200 without interfering radiation properties of the radiator 222.

Figure 5:
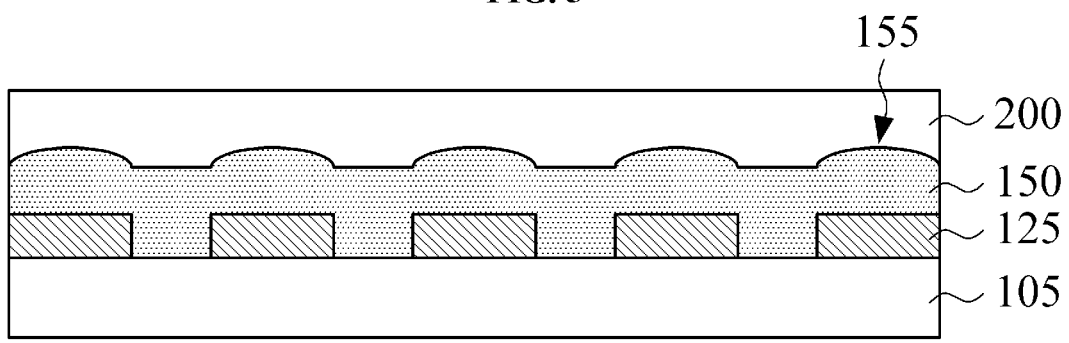
FIG. 5 is a schematic cross-sectional view illustrating a bonding portion of an antenna package in accordance with exemplary embodiments.

FIG. 5 is a schematic cross-sectional view illustrating a bonding portion of an antenna package in accordance with exemplary embodiments.

Referring to FIG. 5, as described above, the bonding region of the antenna device 200 and the first region I of the circuit board 100 may be bonded to each other by the bonding intermediate film 150.

The bonding intermediate film 150 may include an anisotropic conductive film (ACF). For example, the bonding intermediate film 150 may include a resin layer and conductive balls dispersed in the resin layer.

The conductive balls may be connected with each other in a vertical direction by the heat-pressing process, so that the signal pad 126 and the feeding portion of the signal wiring 110 may be electrically connected.

In example embodiments, the line patterns 125 may be spaced apart from each other, so that a local variation of the heat applied in the bonding process may be prevented or reduced. Accordingly, the heat may be uniformly distributed throughout the anisotropic conductive film.

Thus, an activation degree of the resin and conductive balls in the anisotropic conductive film may also be uniformly distributed. Therefore, a constant adhesive force may be achieved throughout a bonding portion, and bonding reliability of the antenna package may be improved.

In some embodiments, the bonding intermediate film 150 may include convex portions 155. The convex portions 155 may be formed in regions corresponding to the line patterns 125.

A contact area between the antenna device 200 and the bonding intermediate film 150 may be additionally increased by the convex portions 155. Accordingly, bonding reliability of the antenna package may be further improved.

Figure 6:
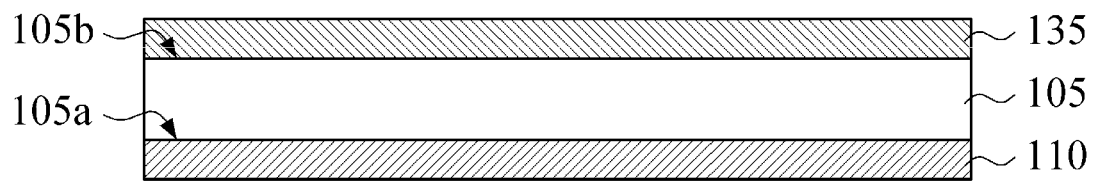
FIG. 6 is a schematic cross-sectional view illustrating a circuit board for an antenna in accordance with some exemplary embodiments.

FIG. 6 is a schematic cross-sectional view illustrating a circuit board for an antenna in accordance with some exemplary embodiments.

Referring to FIG. 6, the antenna circuit board may further include a vertical ground 135.

For example, the core layer 105 may include a first surface 105a and a second surface 105b that face each other. The signal wiring 110 and the co-planar ground 120 may be formed on the first surface 105a. The vertical ground 135 may be disposed on the second surface 105b.

The vertical ground 135 may cover the signal wiring 110 when projected in a plan view. Accordingly, an electric field may be formed at an inside of the core layer 105 between the vertical ground 135 and the signal wiring 110, and a signal transmission speed through the signal wiring 110 may be increased.

Figure 7:
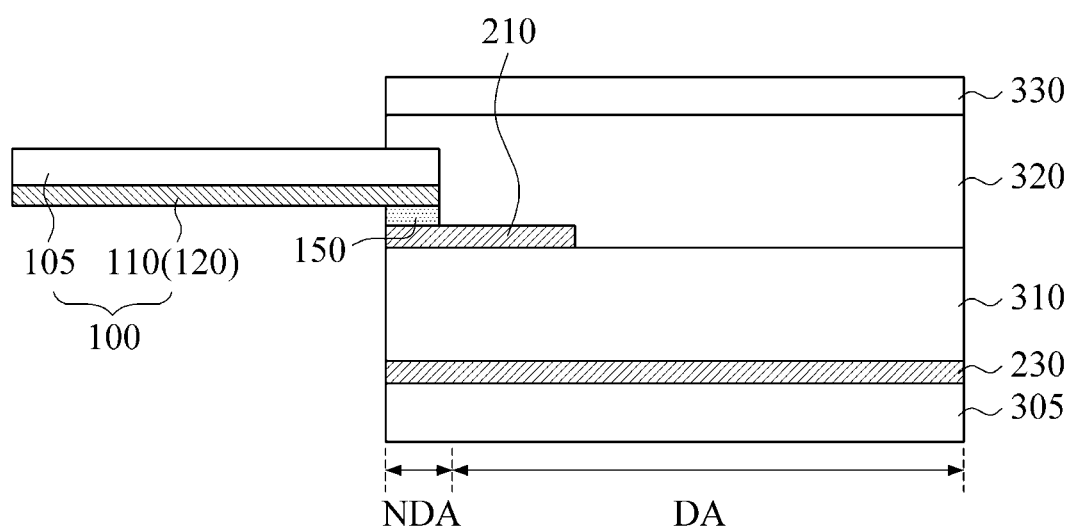

FIGS. 7 and 8 are a schematic cross-sectional view and a schematic plan view, respectively, illustrating an image display device including an antenna package in accordance with exemplary embodiments.

For example, FIG. 8 shows a front portion or a window surface of an image display device implemented in the form of a smart phone. For convenience of descriptions, the signal wiring 110 among the conductive layers of the circuit board is only shown in FIG. 8.

Referring to FIGS. 7 and 8, an image display device 300 may include a display area DA and a non-display area NDA. The non-display area NDA may be disposed at both end portions or both lateral sides of the display area DA, and may include a periphery of the image display device 300.

For example, the non-display area NDA may include a bezel portion and may include a bonding portion of an antenna package.

The image display device 300 includes a display panel 305, and the antenna package in which the antenna device including the antenna unit 220 and the circuit board 100 are combined may be disposed on the display panel 305.

The display panel 305 may include a TFT array substrate, and a pixel structure including an OLED display layer or a liquid crystal display layer formed on the TFT array substrate.

A first dielectric layer 310 may be stacked on the display panel 305. The first dielectric layer 310 may be included as, e.g., the dielectric layer 205 of the antenna device 200.

The first dielectric layer 310 may include, e.g., a transparent resin material. For example, the first dielectric layer 310 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the first dielectric layer 310.

In some embodiments, the first dielectric layer 310 may include an inorganic insulating material such as silicon oxide, silicon nitride, silicon oxynitride, glass, etc.

In one embodiment, the first dielectric layer 310 may be provided as a substantially single layer. In one embodiment, the first dielectric layer 310 may include a multi-layered structure of at least two or more layers.

In some embodiments, a dielectric constant of the first dielectric layer 310 may be adjusted in a range from about 1.5 to about 12. When the dielectric constant exceeds about 12, driving in a desired high or ultra-high frequency band may not be implemented due to an excessively reduced driving frequency.

In some embodiments, an antenna ground layer 230 overlapping the antenna unit 220 in a thickness direction may be disposed on a bottom surface of the first dielectric layer 310. A vertical radiation from the radiator 222 toward the front portion of the image display device 300 may be substantially implemented by the antenna ground layer 230.

The antenna ground layer 220 may include the metal and/or an alloy described above. In some embodiments, the antenna device may be defined by the antenna ground layer 230, the first dielectric layer 310 and the antenna unit 220.

In some embodiments, a conductive member of the image display device 300 to which the antenna package is applied may serve as the antenna ground layer 230.

The conductive member may include, e.g., a gate electrode of a thin film transistor (TFT) included in a display panel, various wirings such as a scan line or a data line, or various electrodes such as a pixel electrode or a common electrode.

In one embodiment, various structures including a conductive material disposed under the display panel 305 may serve as the antenna ground layer. For example, a metallic plate (e.g., a stainless steel plate such as a SUS plate), a pressure sensor, a fingerprint sensor, an electromagnetic wave shielding layer, a heat dissipation sheet, a digitizer, etc., may serve as the antenna ground layer.

As described above, the circuit board 100 may be electrically connected to the antenna unit 220 through the bonding intermediate film 150.

The image display device 300 or the antenna device may include a second dielectric layer 320 covering the antenna unit 220. The second dielectric layer 320 may also cover the circuit board 100 in the bonding region.

A cover window 330 may be disposed on the second dielectric layer 320. The cover window 330 may include a hard coating film or glass (e.g., UTG).

As illustrated in FIG. 8, a rear end portion of the circuit board 100 of the antenna package may be bent and electrically connected to the antenna driving IC chip 180 disposed under the display panel 305.

For example, rear end portions of the co-planar ground 120 and the signal wiring 110 in the second region II of the circuit board 100 may be bent below the display panel 305. The antenna driving IC chip 180 may be mounted on the chip mounting board 170, and may be electrically connected to the circuit board 100 and the antenna unit 220 through the connector 180.

According to the above exemplary embodiments, adhesion properties with the antenna device 200 may be enhanced using the line patterns 125 included in the co-planar ground 120 of the circuit board 100 and separated from the signal wiring 110 and the signal pad 226 without disturbing the antenna properties. Accordingly, when the circuit board 100 is bent, coupling stability of the circuit board 100 in the bonding region may be maintained, and feeding reliability to the antenna unit 220 may be maintained.

What is claimed is:

1. A circuit board for an antenna, comprising:
   a core layer;
   a signal wiring disposed on a surface of the core layer; and
   a co-planar ground disposed around the signal wiring on the surface of the core layer, the co-planar ground comprising line patterns adjacent to a front end portion of the signal wiring,
   wherein a plurality of the signal wirings are arranged in a width direction of the core layer, and a plurality of the line patterns are arranged between neighboring signal wirings of the plurality of the signal wirings.

2. The circuit board for an antenna according to claim 1, wherein a plurality of the line patterns are arranged at each of both lateral sides of the front end portion of the signal wiring.

3. The circuit board for an antenna according to claim 1, wherein the core layer has a first region in which the front end portion of the signal wiring is disposed and a second region adjacent to the first region, and the co-planar ground has a solid conductive layer structure in the second region.

4. The circuit board for an antenna according to claim 3, wherein a pair of the co-planar grounds are disposed with the signal wiring interposed therebetween in the second region.

5. The circuit board for an antenna according to claim 1, wherein the signal wiring has a branched structure comprising a plurality of feeding portions, and the line patterns are arranged around the feeding portions.

6. The circuit board for an antenna according to claim 5, wherein bonding units are defined by one feeding potion of the feeding portions, and the line patterns arranged at both lateral sides of the one feeding portion, and
   the line patterns in each of the bonding units are spaced apart by a first slit, and the bonding units neighboring each other are spaced apart by a second slit.

7. The circuit board for an antenna according to claim 6, wherein a width of the second slit is greater than a width of the first slit.

8. An image display device comprising:
   a display panel;
   an antenna unit disposed on the display panel; and
   the circuit board for an antenna of claim 1 electrically connected to the antenna unit.

9. The image display device according to claim 8, further comprising an antenna driving integrated circuit chip disposed under the display panel.

10. The image display device according to claim 9, wherein the circuit board for the antenna is bent under the display panel to be electrically connected to the antenna driving integrated circuit chip.

11. An antenna package comprising:
an antenna device; and
a circuit board bonded with the antenna device, the circuit board comprising:
a core layer;
a signal wiring disposed on a surface of the core layer; and
a co-planar ground disposed around the signal wiring on the surface of the core layer, the co-planar ground comprising line patterns adjacent to a front end portion of the signal wiring,
wherein a plurality of the signal wirings are arranged in a width direction of the core layer, and a plurality of the line patterns are arranged between neighboring signal wirings of the plurality of the signal wirings.

12. The antenna package according to claim 11, further comprising a bonding intermediate film coupling the antenna device and the circuit board.

13. The antenna package according to claim 12, wherein the line patterns are spaced apart with slits interposed therebetween, and the bonding intermediate film is attached on the line patterns to fill the slits.

14. The antenna package according to claim 13, wherein the bonding intermediate film has convex portions on the line patterns.

15. The antenna package according to claim 11, wherein the antenna device comprises:
a dielectric layer; and
an antenna unit disposed on the dielectric layer, the antenna unit comprising a radiator, a transmission line extending from the radiator, a signal pad formed at an end portion of the transmission line and a ground pad disposed around the signal pad.

16. The antenna package according to claim 15, wherein the line patterns comprise first line patterns arranged on the ground pad and second line patterns not overlapping the ground pad.

17. The antenna package according to claim 16, wherein the number of the second line patterns is greater than the number of the first line patterns.

* * * * *